United States Patent [19]

Tatematsu et al.

[11] Patent Number: 4,696,861
[45] Date of Patent: Sep. 29, 1987

[54] SUBSTRATE PROCESSED FOR ELECTROLESS PLATING FOR PRINTED WIRING PATTERN AND PROCESS FOR MANUFACTURING THE PROCESSED SUBSTRATE

[75] Inventors: Hiromu Tatematsu; Takeshi Miyabayashi, both of Nagoya, Japan

[73] Assignee: Brother Kogyo Kabushiki Kaisha, Japan

[21] Appl. No.: 906,624

[22] Filed: Sep. 10, 1986

Related U.S. Application Data

[63] Continuation of Ser. No. 666,778, Oct. 31, 1986, abandoned.

[30] Foreign Application Priority Data

Nov. 9, 1983 [JP] Japan ............................ 58-210610

[51] Int. Cl.$^4$ ................................................ B32B 5/16
[52] U.S. Cl. ..................................... 428/328; 428/901
[58] Field of Search .................................. 428/328, 901

[56] References Cited

U.S. PATENT DOCUMENTS

| | | | |
|---|---|---|---|
| 3,146,125 | 8/1964 | Schneble, Jr. et al. | 428/901 X |
| 4,110,147 | 8/1978 | Grunwald et al. | 156/151 X |
| 4,167,582 | 9/1979 | Takahashi et al. | 428/328 |
| 4,247,594 | 1/1981 | Shea et al. | 428/328 |
| 4,281,038 | 7/1981 | Ambros et al. | 428/328 X |
| 4,284,684 | 8/1981 | Kubota | 428/328 |
| 4,323,599 | 4/1982 | Marshall | 428/328 X |

FOREIGN PATENT DOCUMENTS

| | | | |
|---|---|---|---|
| 49-55723 | 5/1974 | Japan | 428/328 |
| 0042868 | 3/1980 | Japan | 428/328 |
| 0148152 | 11/1980 | Japan | 428/328 |

Primary Examiner—John E. Kittle
Assistant Examiner—Patrick J. Ryan
Attorney, Agent, or Firm—Parkhurst & Oliff

[57] ABSTRACT

A processed substrate which is adapted to be subjected to electroless plating with a conductive material to produce a metal-plated board for manufacturing a printed-wiring board having a wiring pattern formed of the conductive plating layer. The processed substrate comprises a metal oxide film consisting of fine particles of a reducible metal oxide which are distributed locally only on the surface of the insulating base. Portions of the fine particles are embedded in a skin layer of the insulating base and the remaining portions are exposed over the surface of the insulating base. The process of manufacturing the processed substrate comprises a step of depositing the metal oxide film in a physical vapor deposition process wherein the ionized metal oxide is bombarded onto the surface of the insulating base. The physical vapor deposition process may be a reactive deposition process, an-ion plating process or a sputtering process.

9 Claims, 8 Drawing Figures

SUBSTRATE PROCESSED FOR ELECTROLESS PLATING FOR PRINTED WIRING PATTERN AND PROCESS FOR MANUFACTURING THE PROCESSED SUBSTRATE

This is a continuation of application Ser. No. 666,778, filed Oct. 31, 1986, now abandoned.

BACKGROUND OF THE INVENTION

1. Field of the Art

The present invention relates to the treatment of a substrate so that it is suitably coated with a conductive material, by chemical or electroless plating technique, to produce a printed-wiring board having an improved wiring quality.

2. Description of the Prior Art

In the art of forming a printed wiring pattern on a printed-wiring board by applying a chemical or electroless plating layer of metal to a starting material, i.e., to an electrically insulating substrate or base, it is generally practiced to apply a catalyst to the insulating base so as to start an electroless plating reaction on the surface of the insulating base. To this end, palladium or other noble metals are added as such a catalyst to the insulating material, prior to the electroless plating of the insulating base. However, the mere addition of the catalyst does not permit an electroless plating layer to be formed with excellent heat resistance, and high adhesion to the insulating base. These are physical properties required of a printed-wiring board.

In view of the above requirements, a catalyst for electroless plating is traditionally applied to an insulating base for a printed-wiring board, by employing one of methods shown in FIGS. 1–4. The first method is illustrated in FIGS. 1 and 2, wherein a prepreg is prepared by pre-impregnating cellulose or craft paper with a varnish admixed with a complex compound containing palladium as a catalyst 2. Plural prepregs prepared in this manner are laminated into an electrically insulating base 3. The thus obtained insulating base 3 is coated with layers 4 of an adhesive consisting essentially of a mixture of denaturated phenolic resin and nitrile rubber which contains catalytic cores 5 of a metal oxide. Prior to applying this adhesive layer 4 to the insulating base 3, the adhesive is mixed with catalytic cores 5 of a metal oxide which are soaked with an activating solution of tin chloride (stannous chloride), palladium chloride, hydrochloric acid and other activating agent. The insulating base 3 and the adhesive layers 4 containing the catalytic cores 5 constitute a processed substrate 1 which is subsequently subjected to electroless plating. Thus, both of the insulating base 3 and the adhesive layers of 4 of the processed substrate 1 contain the catalyst. However, the concentration of the catalyst adjacent to the surface of the substrate 1 is not sufficiently high, i.e., low particularly at the inner surface defining a through-hole formed in the substrate 1, and therefore the substrate tends to suffer the generation of blow holes. To avoid this drawback, it is necessary to additionally apply the catalyst 2 to the inner surface of a through-hole on the substrate by using a solution of tin (stanneous) chloride, palladium chloride and hydrochloric acid, before the surfaces of the adhesive layers 4 are roughed for exposing the catalytic cores 5.

An alternative known method is shown in FIG. 3, wherein substantially the same steps as used in the method of FIG. 1 are taken to produce a processed substrate 1 illustrated in FIG. 4, which is different from the substrate of FIG. 2 only in that the substrate prepared with the alternative method does not contain the catalyst 2 within the insulating base 3. Like the preceding method, however, this alternative method also includes the step of applying the catalyst 2 to the surfaces of the adhesive layers 4 by using an activating solution of tin (stanneous) chloride, palladium chloride and hydrochloric acid.

The above-discussed known methods and the processed substrates prepared with these methods, which are used to produce metal-plated boards for printed-wiring boards, have the following inconveniences:

(1) Since the crystallization of a metal to be applied to the substrate 1 by electroless plating requires the presence of the catalyst 2 and the catalytic cores 5 only at the skin of the adhesive layers 4 applied to the insulating base 3, the catalyst 2 and catalytic cores 5 which are present in the insulating base 3 and in the interior of the adhesive layers 4 according to the known methods are not necessary, and cause an increase in cost of manufacture of the end product, i.e., a printed-wiring board produced from the substrate 1 plated with a conductive material. Further, the catalyst and catalytic cores within the substrate 1 will lead to deterioration of the properties of the printed-wiring board.

(2) The known methods use as the catalytic cores 5 solid solutions of oxides, for example, ground powder of $ZrSiO_4$ (zircon), $SiO_2$ (silica), $Al_2O_3$ (alumina), $TiO_2$ (titania) and $Al_2Si_2O_5(OH)_4$ (kaolinite). The size of such powder is as large as approx. 2–10$\mu$. In fact, it is preferred that the catalytic cores 5 be fine particles, for example, less than 1$\mu$. In other words, the known processed substrate 1 containing the catalytic cores 5 of relatively large size is more likely to have a rough surface, which degrades the resolution of a wiring pattern formed by printing or dry film technique, and reduces crystallinity of the electroless plating layer which forms, or a portion of which is left to form a wiring pattern.

(3) Since the catalytic cores 5 are admixed with the adhesive 4, and applied to the insulating base 3 in the form of the adhesive layers 4, the distribution of the cores 5 over the surfaces of the adhesive layers 4 is not satisfactory, and it is very difficult to attain a sufficient concentration of the catalytic cores 5 on the surfaces of the adhesive layers 4. On the contrary, increasing the concentration of the catalytic cores 5 within the adhesive layers 4 will result in degrading the properties of the adhesive. Thus, the known methods have such a dilemma. In the case where an electroless plating is applied to the known substrate 1 with the catalytic cores 5 contained in the manner described above, the plating layer generally has a low peeling strength (flake-off resistance), i.e., 1.2–2.0 Kg/cm at 25° C. The peeling strength at elevated temperatures is abruptly lowered to 0.3–0.7 Kg/cm. In other words, a printed-wiring board prepared from the known processed substrate 1 has a low soldering heat resistance, and consequently may suffer a trouble that the wiring pattern is easily separated or peeled off from the substrate when the components on the board are replaced.

(4) The previously described additional application of the catalyst 2 in an activating solution causes the reduction in insulation resistance of the substrate 1. Further, if there exists an excess of the catalyst 2 which is not firmly bonded to the catalytic cores 5, the adhesion of a subsequently applied electroless plating layer to the insulating base 3 will be reduced.

(5) The adhesiveness of the electroless plating layer relative to the insulating base 3 depends largely on the result of surface roughing operation which is effected for the purpose of exposing the catalyst 2 and catalytic cores 5 existing adjacent the surfaces of the adhesive layers 4 on the insulating base 3. Accordingly, it is difficult to suitably control the surface roughing operation for obtaining an electroless plating layer of consistent quality. The roughing operation may induce another problem that drips of a roughing solution cause the extension of a plating layer in an area in which a wiring pattern is not intended to be formed.

(6) The known processed substrate 1 requires the use of a specially designed insulating base and a specific adhesive agent, which complicates the fabrication procedure, increases the variation in quality, and pushes up the cost of manufacture, of the processed substrate.

SUMMARY OF THE INVENTION

It is therefore an object of the present invention to minimize the inconveniences experienced in the prior art, that is, to provide a processed substrate which uses a commonly available inexpensive insulating base which is coated, in a flash-addition or physical vapor deposition process, with a reducible metal oxide acting as catalytic cores having self-catalyzation property to facilitate the formation of an electroless plating layer of metal, and thereby improving the adhesion, and the soldering heat resistance, of the electroless plating layer of metal, which layer is subsequently applied to the insulating base for producing a printed-wiring board having a printed wiring pattern.

Another object of the invention is to provide a metal-plated board which comprises such a processed substrate, and an electroless plating layer of a conductive material applied to the surface of the substrate with improved adhesion thereto and increased heat resistance.

A further object of the invention is to provide a process of manufacturing the above indicated processed substrate.

It is a still further object of the invention to provide a process of manufacturing the above indicated metal-plated board.

According to the invention, there is provided a processed substrate including an electrically insulating base which is adapted to be subjected to electroless plating with an electrically conductive material to produce a metal-plated board which is used for manufacturing a printed-wiring board, comprising a metal oxide film consisting of a large number of fine particles of a reducible metal oxide. The metal oxide particles are distributed over a surface of the insulating base. Portions of the fine particles are embedded in a skin layer of the insulating base adjacent its surface so that the metal oxide film is fixed to the surface of the insulating base. The remaining portions of the fine particles are exposed over the surface of the insulating base. The fine particles of metal oxide are absent in the interior of the insulating base.

According to the invention, there is also provided a metal-plated board comprising an electrically insulating base and an electroless plating layer of an electrically conductive material on the surface of the insulating base, at least a portion of the electroless plating layer, wherein the improvement comprises:

a metal oxide film consisting of a large number of fine particles of a reducible metal oxide which are fixedly distributed over a surface of the insulating base, portions of the fine particles being embedded in a skin layer of the insulating base adjacent its surface so that the metal oxide film is fixed to the surface of the insulating base, the remaining portions of the fine particles being exposed over the surface of the insulating base, the fine particles of the metal oxide serving as catalytic cores having self-catalyzation property to facilitate the formation of the electroless plating layer to be applied to the surface of the insulating base.

According to another aspect of the invention, there is provided a process of manufacturing a processed substrate including an electrically insulating base which is adapted to be subjected to electroless plating with an electrically conductive material to produce a metal-plated board which is used for manufacturing a printed-wiring board, comprising:

bombarding a large number of fine particles of a reducible metal oxide on a surface of the insulating base, in a physical vapor deposition process, to deposit a metal oxide film consisting of said fine particles, portions of the fine particles being embedded in a skin layer of the insulating base adjacent its surface so that the metal oxide film is fixed to the surface of the insulating base, the remaining portions of the fine particles being exposed over the surface of said insulating base. The fine particles of metal oxide are not present in the interior of the insulating base.

In one form of the process of the invention, the vapor deposition process is a reactive deposition process, which may be an Activated Reactive Evaporation (ARE) process or an Low-Pressure Plasma Deposition (LPPD) process. In the ARE process, an electron beam gun is used to heat and evaporate a metal in the atmosphere of a reaction gas, and 4 glow discharge or high-frequency discharge is effected to activate the evaporated molecules and reaction gas. The LPPD process is an improvement of the ARE process, wherein an AC voltage or a positive DC voltage is applied directly to the substrate to be processed.

In another form of the process of the invention, the physical vapor deposion process is an ion-plating process which may be a Hollow Cathode Discharge Deposition (HCD) process, a High-Frequency or Radio-Frequency (RF) Ion-Plating process, a Cluster Ion Beam Deposition process, or a Hot Cathode process. The ion-plating process in general is defined as a process in which a thin metallic film is deposited on the insulating base by ionizing the evaporated metallic material in vacuum while a negative voltage is applied to the substrate or an auxiliary electrode disposed adjacent to the substrate. In the HCD process, a hollow cathode discharge gun is used to heat and evaporate the metallic material. In the High-Frequency Ion-Plating process, a high-frequency coil is used as an ionizing electrode for ionizing the vaporized metal oxide in a relatively high vacuum.

In a perferred form of the process of the invention, the metal oxide particles are copper oxide represented by the general formula $Cu_xO_y$, and the High-Frequency Ion-Plating process is used to bombard the fine particles of the copper oxide. In this case, an ionizing electrode is used for ionizing the vaporized copper oxide in a relatively high vacuum, and an auxiliary electrode is disposed adjacent to the surface of the insulating base. The High-Frequency Ion-Plating process comprises: a first step of applying a positive high voltage to the ionizing electrode in a vacuum of around $10^{-3}$ Torr to ionize oxygen and nitrogen around the ionizing electrode, a negative high voltage to the auxiliary electrode to direct the oxygen and nitrogen ions toward the insulating base; and a second step of vaporizing the copper oxide in an oxygen atmosphere, and applying the positive and negative high voltage to the ionizing and auxiliary electrodes, respectively, to ionize the vaporized copper oxide around the ionizing electrode and bombard the $Cu_xO_y$ ions onto the surface of the insulating base.

According to another form of the process of the invention, the physical vapor deposition process is a sputtering process wherein a thin metal layer is deposited on the object placed in a vacuum tube that has a cathode made on the metal to be sputtered. The tube is operated under conditions that promote cathode bombardment by positive ions. As a result, extremely small particles of molten metal fall uniformly on the object and produce on it a thin conductive metal coating.

According to the invention, there is also provided a process of manufacturing a metal-plated board comprising an electrically insulating base and an electroless plating layer of an electrically conductive material on the surface of the insulating base, at least a portion of the electroless plating layer, said process comprising the steps of:

applying a primer coating to the surface of the insulating base;

roughing the surface of the primer coating to increase an area of contact of the primer coating with said electroless plating layer;

bombarding a large number of fine particles of a reducible metal oxide on a surface of the insulating base, in a physical vapor deposition process, to deposit a metal oxide film consisting of said fine particles, portions of the fine particles being embedded in a skin layer of the insulating base adjacent to its surface so that the metal oxide film is fixed to the surface of the insulating base, the remaining portions of the fine particles being exposed over the surface of said insulating base;

activating the insulating base with the metal oxide film in an activating solution, to enhance the self-catalyzation property of the metal oxide film; and applying the electroless plating layer to the surface of the metal oxide layer.

BRIEF DESCRIPTION OF THE DRAWING

The above and other objects, features and advantages of the present invention will become more apparent from reading the following description of the preferred embodiment taken in connection with the accompanying drawiang in which:

FIG. 3 is a flow chart showing an alternative process of preparing a similar substrate known in the art;

DETAILED DESCRIPTION OF THE PREFERRED EMBODIMENT

Figure 5:
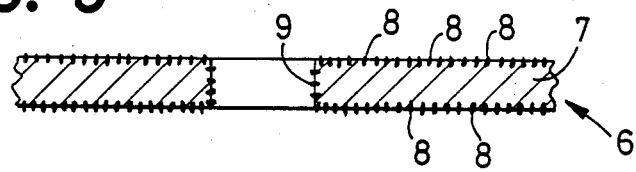
FIG. 5 is a schematic illustration in cross section of one embodiment of a processed substrate of the present invention.
Figure 6:
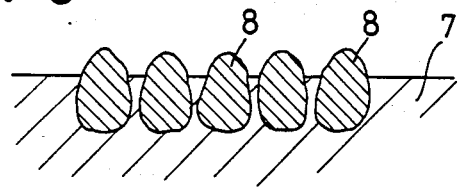
FIG. 6 is a fragmentary illustration in enlargement of the substrate of FIG. 5.

Referring to FIGS. 5 through 8 of the accompanying drawing, a preferred embodiment of the invention will be described in detail. There is shown in FIGS. 5 and 6 a processed substrate 6 including an electrically insulating base 7 which is adapted to be subjected to electroless or chemical plating with an electrically conductive material to produce a metal-plated board which is used for manufacturing a printed-wiring board. The surface of the insulating base 7 is covered with a metal oxide film. More specifically described, the insulating base 7 is plated in an ion-plating process to apply a metal oxide film which consists of a large number of fine particles 8 of a copper oxide. The copper oxide particles 8, which serve as catalytic cores, are distributed over the surface of the insulating base 7, by flash addition during the ion-plating process, so that a portion of each particle 8 is embedded in a skin layer of the insulating base 7 adjacent to its surface, and the remaining portion is exposed over the surface of the insulating base 7. This specific method of plating according to one embodiment of the invention, i.e., the ion-plating process permits the copper oxide particles 8 to have substantially uniform grain sizes of $0.02$–$0.1\mu$, and to be firmly fixed to the surface of the insulating base 7. The insulating base 7 is made of a suitable material generally used for a printed-wiring board. For example, the insulating base 7 is made from a glass plate, sheet of glass impregnated with epoxy resin, sheet of paper, sheet of synthetic fiber, cross sheet, sheet of phenol resin, polyester, polyimide, polysulfone, or polycarbonate. On the other hand, the copper oxide particles 8 consist of a copper oxide which is represented by the general formula $Cu_xO_y$. Reference numeral 9 designates a through-hole formed in the processed substrate 6. According to the instant ion-plating process, the copper oxide particles 8 are partially embedded in the inner surface of the insulating base 7 defining the through-hole 9, as firmly as the particles 8 on the opposite sides of the insulating base 7.

PROCESS OF PREPARATING SUBSTRATE 6

Figure 7:
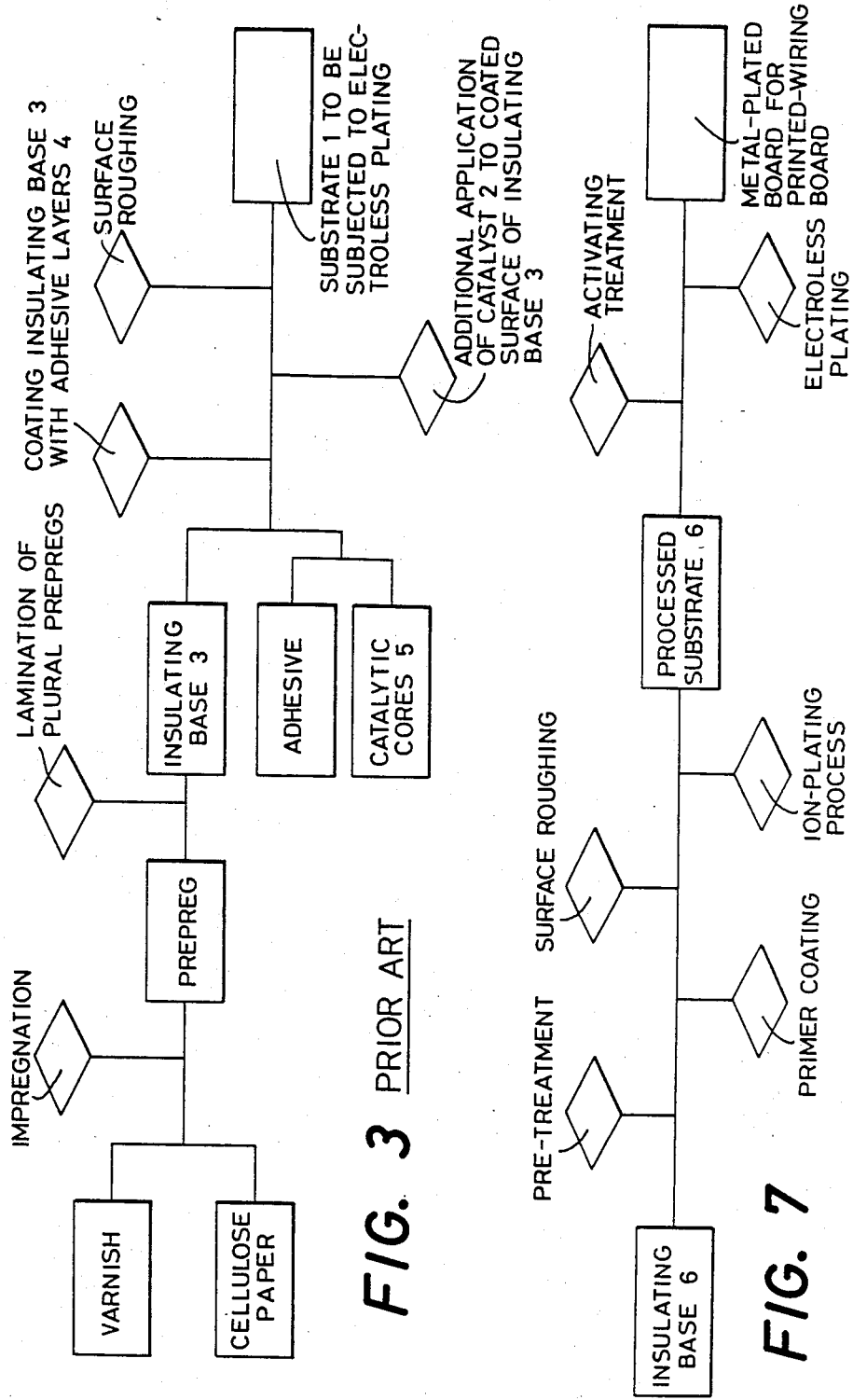
FIG. 7 is a flow chart showing a process of preparing the processed substrate of FIG. 5 according to the invention, and manufacturing a metal-plated board by plating the prepared substrate.
Figure 8:
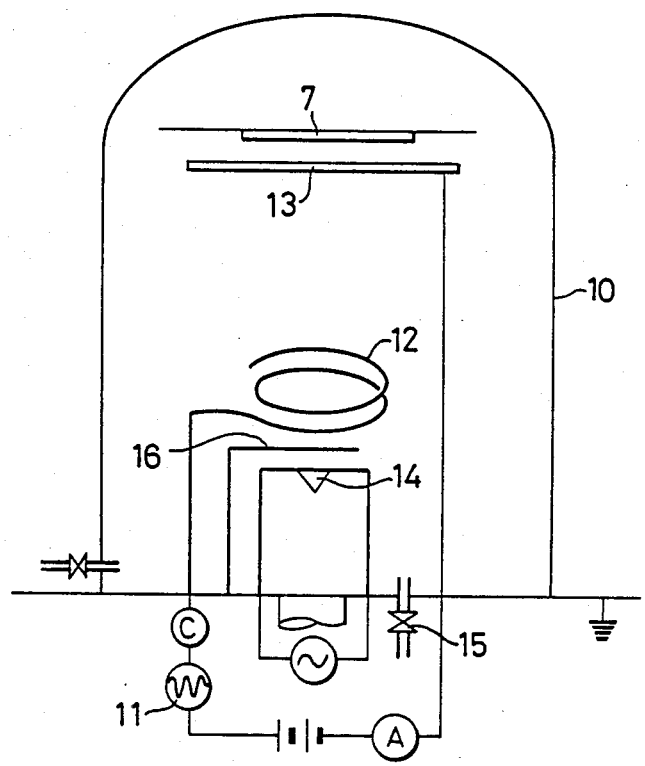
FIG. 8 is an illustration showing a ion-plating apparatus used in the process of the invention.

Referring next to FIGS. 7 and 8, the process of preparing the processed substrate 6 will be described in greater detail.

The following materials were used for the insulating base 7 and a primer coating:

Insulating Base 7: Paper impregnated with phenol
Primer Coating: Mixture of denaturated phenolic resin and nitrile rubber (A5-002 available from Nippon Gosei kagaku)

The term "primer coating" is interpreted to mean a film of resin of $5$–$10\mu$ thickness which does not contain an inorganic material (metal oxide). The primary purpose of applying a primer coating to the insulating base material (made essentially of paper) is to prevent the insulating base 7 from emitting gases within a bell jar which is used as described later.

As previously indicated, the catalytic cores 8 made of copper oxide (CuO) were vapor-deposited as a metal oxide film on the surfaces of the insulating base 7, using an ion-plating process which is one of physical vapor deposition processes.

Pre-Treatment of the Insulating base Material

To begin with, the surfaces of the insulating base 7 were degreased by mechanical grinding, or with vapors of trichlene (trichloroethylene).

Application of Primer Coating

After the insulating base 7 was degreased, the primer coating material indicated above was applied to the opposite surfaces of the insulating base 7 so that the thickness of the coating was about $10\mu$ after the coating was dried.

Surface Roughing

After the primer coating was dried, the surfaces of the primer coating were roughed by keeping the insulating base 7 in a roughing solution of the following composition, for ten minutes.

Roughing Solution:

One liter of roughing solution was prepared by dissolving in water 450 g of fluoroboric acid 20 g of sodium dichromate and 5 g of boric acid.

Figure 2:
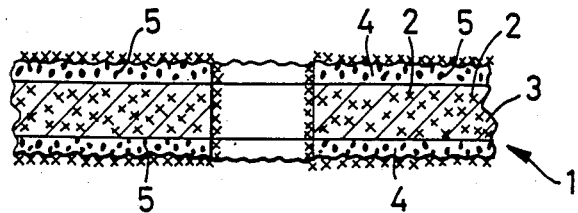
FIG. 2 is a schematic view in cross section of the known substrate prepared according to the process of FIG. 1.
Figure 4:
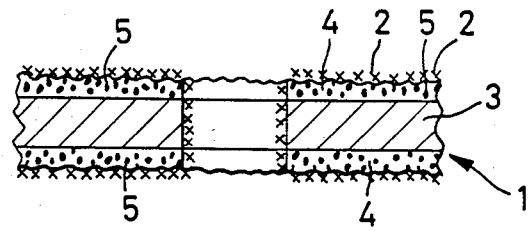
FIG. 4 is a schematic view in cross section of the known substrate prepared in accordance with the process of FIG. 3.

While the primary purpose of a surface roughing operation performed in the prior art is to expose the catalyst 2 and catalytic cores 5 in the adhesive layers 4 (FIGS. 2 and 4), the surface roughing step according to the invention has the purpose of increasing an area of contact of the primer coating on the base 7 with an electroless plating layer to be subsequently applied, and thereby increasing the force of adhesion of the plating layer to the insulating base 7.

Ion-Plating Process

The insulating base 7 which had been subjected to the preceding treatment steps, was placed in a bell jar 10 shown in FIG. 8. The bell jar 10 is first evacuated to approx. $10^{-3}$ Torr, and a high-frequency discharge of some hundreds of watts was induced by means of an ionizing electrode in the form of a high-frequency coil 12 by activating a high-frequency power source 11 while the bell jar 10 was kept under the vacuum pressure specified above. The ionizing voltage and current were 1-2 Kv and 100-200 mA, respectively. In this condition, a DC bias voltage of $-1$ Kv was applied to an auxiliary electrode 13 located adjacent to and in front of the insulating base 7. As a result, oxygen and nitrogen ions produced around the inonizing electrode (high-frequency coil) 12 were accelerated and directed toward the auxiliary electrode 13. Since the auxiliary electrode 13 is of grid or lattice structure, the oxygen and nitrogen ions pass through the lattice structure and were bombarded onto the surface of the insulating base 7 located behind the auxiliary electrode 13. This ion bombardment was continued for about one to five minutes. Then, the high-frequency discharge is interrupted and the bell jar was further evacuated to $10^{-5}$ Torr. Subsequently, a crucible 14 accommodating CuO was heated to a predetermined temperature, and an oxygen gas was introduced through an gas inlet valve 15 until the vacuum was reduced to $10^{-3}$–$10^{-4}$ Torr. In the next step, the high-frequency power source 11 was turned on to induce again a high-frequency discharge of some hundreds of watts. The ionizing voltage and current at this time were 1-2 Kv and 100-200 mA, respectively. In this condition, a DC bias voltage of $-1$ Kv was applied again to the auxiliary electrode 13, whereby oxygen ions existing around the ionizing electrode 12 were directed toward the auxiliary electrode 13. By opening a shutter 16 positioned above the crucible 14 in this condition, vapors of Cu, $Cu_2O$ and CuO were ionized around the ionizing electrode 12. In the plasma generated around the ionizing electrode 12, there existed ions of Cu, $Cu_2O$, CuO and $O_2$. It is considered that these ions react with each other and are re-bonded to each other, and exist in the form of $Cu_xO_y$. The $Cu_xO_y$ ions are directed toward the auxiliary electrode 13, and deposited on the surface of the insulating base 7 as the catalytic cores of $Cu_xO_y$.

It is generally noted that the $Cu_xO_y$ has a lower rate of diffusion over the surface of the insulating base 7 than the Cu. This contributes to the fact that the copper oxide $Cu_xO_y$, when flash-added, i.e., vapor-deposited, was applied to the surface of the insulating base, in the form of spherical particles of about 200 angstroms which were distributed to form a copper oxide film. The vapor-deposition of the $Cu_xO_y$ particles was effected for a time span on the order of a few seconds to some tens of seconds. The $Cu_xO_y$ film had an average thickness on the order of some tens to some hundreds of angstroms, as calculated assuming that a total volume of the particles 8 is converted into the volume of the copper oxide film of uniform thickness. Thus, the ion-plating operation was completed within an extremely short time, which indicates an increased economy of continuous on-line manufacture of the processed substrate 6.

The above described steps completed an ion-plating cycle wherein the $Cu_xO_y$ particles were partially embedded, through bombardment, in the skin layer of the insulating base 7. This manner of application of the copper oxide film to the insulating base 7 assures an increased concentration of the catalytic cores 8 (copper oxide particles) on the surface of the base 7.

Electroless Copper-Plating Process

The processed substrate 6 which was prepared as discussed hitherto, is plated with copper in an ordinary electroless or chemical plating process. The electroless plating layer obtained had a $30\mu$ thickness. In this connection, it is noted that the $Cu_xO_y$ catalytic cores 8 bombarded on the surface of the insulating base 7 through ionization of the copper oxide, has self-catalyzation property which permits the plating layer of copper to grow in the specific directions. Hence, the use of a catalyst such as palladium required in the prior art is unnecessary in the process according to the present invention. This self-catalyzation property of the catalytic cores 8 is enhanced and a better electroless plating result is obtained, by activating the processed substrate 6 prior to the electroless plating operation. The activating step was effected by usisng an activating solution of the following composition:

Activating Solution:
NaOH: 4N
HCHO (37% solution): 500 ml/l
Temperature: 80° C.

Physical Property Test

The copper plating layer applied to the processed substrate 6 was tested in terms of adhesive force (flake-off resistance) to the substrate 6, and soldering heat resistance. The following results were obtained.

Adhesion force (force required to peel off the plating layer:
6.0 Kg/cm at 25° C.
3.2 Kg/cm at 150° C.
(according to JIS C5012).

Resistance to soldering heat: not shorter than 10 minutes at 270° C. (according to MIL-STD-202E 210A).

As indicated above, it was found the processed substrate 6 prepared according to the invention assures improved adhesion of a copper plating layer applied thereto, and increased heat resistance of the plating layer upon soldering.

As described hitherto in detail, the illustrated processed substrate 6 prepared according to the illustrated process of the invention is provided with the fine particles 8 of copper oxide which are deposited as catalytic cores, by bombardment in an ion-plating process, on the surface of the insulating base 7. These catalytic cores 8 demonstrate the previously indicated self-catalyzation property, and are firmly held on the surface of the insulating base 7. Hence, palladium or other conventionally used catalyst contained in the insulating base and/or adhesive layers (FIGS. 2 and 4) is not required, whereby the cost of manufacture of the processed substrate 6 is minimized. Further, in the absence of any catalyst in the interior of the insulating base 7, the properties of a printed-wiring board to be manufactured from the processed substrate 6 will not be degraded by such catalyst.

According to the illustrated embodiment of the invention, the copper oxide particles 8 are given relatively small average diameters of $0.02$–$0.1\mu$, thanks to the ion-plating process wherein the copper oxide is ionized, and the copper oxide ions are deposited as catalytic cores through high-speed movements of the ions. Consequently, the surface of the processed substrate 6 is considerably smoothed, whereby the crystallinity of an electroles plating layer to be applied to the substrate 6 is enhanced, and the resolution of a wiring pattern to be formed by the electroless plating layer is appreciably improved.

Further, since the instant embodiment does not require the application of the conventional adhesive layers 4 containing the catalytic cores 5, to the surfaces of the insulating base 6, there arises no problem associated with dispersion of catalytic cores (copper oxide particles 8) over the surface of the insulating base 7. In the illustrated embodiment, the insulating base 7 is provided with a copper oxide film (layer of catalytic cores) having a uniform average thickness on the order of some tens to some hundreds of angstroms. In summary, the processed substrate 6 which is coated with the copper oxide film as described so far, makes it possible to produce a copper-plated board with a copper plating layer which has excellent adhesion to the inslating base 7 and high resistance to soldering heat, the copper-plated board being used for manufacturing the end product, a printed-wiring board. In forming a wiring pattern, the copper plating layer is masked with a covering of a configuration corresponding to the desired wiring pattern, and then etched to remove an unnecessary area. Thus, a portion of the copper plating layer is left as the wiring pattern.

Figure 1:
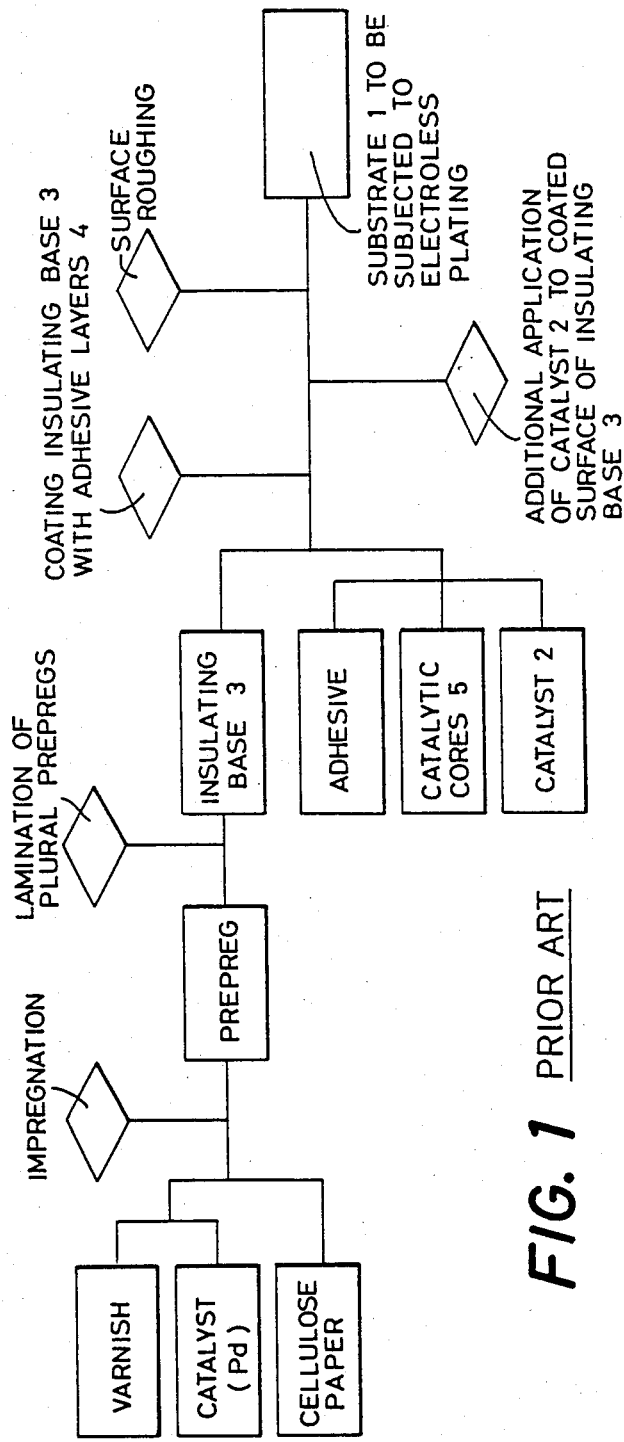
FIG. 1 is a flow chart showing a process of preparing a known substrate which is adapted to be subjected to electroless plating for manufacturing a printed-wiring board.

Further, the illustrated process of the invention does not include the step of additional application of a catalyst to the surfaces of the adhesive layers 4 through use of an activating solution, as practiced in the prior art (indicated in FIGS. 1 and 3), thereby eliminating the possibility of reducing the insulating resistance of the processed substrate 6 due to such additional catalyst.

As explained hitherto, the present invention provides a processed substrate for a printed-wiring board, which substrate includes an electrically insulating base which can be suitably plated with an electrically conductive material in an electroless plating process, with improved adhesion of the plating layer to the insulating base, and with increased heat resistance of the same upon soldering.

While the present invention has been described in its preferred embodiment, it is to be understood that the invention is not limited thereto but may be otherwise embodied within the scope of the following claims. For example, while the entire surface of the substrate 6 of the illustrated embodiment is covered with a copper plating layer and this electroless plating layer is masked and etched so that the plating layer is left as a printed-wiring pattern, it is appreciated that the substrate 6 be masked prior to an electroless plating process so that the plating layer of a conductive material is applied in the form of a wiring pattern.

What is claimed is:

1. A processed substrate including an electrically insulating base which is adapted to be subjected to electroless plating with an electrically conductive material to produce a metal-plated board for manufacturing a printed-wiring board, comprising:
   a metal oxide film consisting of a large number of fine particles of a reducible metal oxide which are distributed over a surface of said insulating base, said fine particles serving as catalytic cores for the electroless plating of said insulating base with said electrically conductive material, portions of each of said fine particles being embedded in a skin layer of said insulating base adjacent to said surface thereof by bombardment of said fine particles onto the surface of the insulating base, so that said metal oxide film is fixed to the surface of the insulating base, the remaining portions of each of the fine particles being exposed over the surface of the insulating base, said fine particles being absent in the interior of said insulating base.

2. The processed substrate of claim 1, wherein the size of said fine particles of the metal oxide is $0.02$–$0.1\mu$.

3. The processed substrate of claim 1, wherein said metal oxide is an oxide of copper of the general formula $Cu_xO_y$.

4. The processed substrate of claim 1, wherein said fine particles of metal oxide are bombarded on the surface of the insulating base by bombardment which occurs in an ion-plating process.

5. The processed substrate of claim 1, wherein said metal oxide film has a thickness on the order of tens to hundreds of angstroms, as calculated assuming that a total volume of said fine particles is converted into the volume of said metal oxide film of uniform thickness.

6. The processed substrate of claim 1, wherein said insulating base is made of a material selected from the group consisting of a glass plate, glass impregnated with epoxy resin, paper, synthetic fiber, cross sheet, phenol resin, polyester, polyimide, polysulfone, and polycarbonate.

7. A metal-plated board comprising an electrically insulating base and an electroless plating layer of an electrically conductive material on the surface of the insulating base, at least a portion of the electroless plating layer forming a printed wiring pattern, wherein the improvement comprises:

a metal oxide film consisting of a large number of fine particles of a reducible metal oxide which are fixedly distributed over a surface of said insulating base, portions of said fine particles being embedded in a skin layer of said insulating base adjacent said surface thereof so that said metal oxide film is fixed to the surface of the insulating base, the remaining portions of the fine particles being exposed over the surface of the insulating base, the fine particles of said metal oxide serving as catalytic cores having self-catalyzation property to facilitate the formation of said electroless plating layer to be applied to the surface of said insulating base.

8. The processed substrate of claim 1, wherein said insulating base has a through-hole formed through a thickness thereof, said skin layer of the insulating base including an inner surface which defines said through-hole.

9. The metal-plated board of claim 7, wherein said metal oxide is an oxide of copper which has said self-catalization property and which is selected from the group consisting of copper oxides of the general formula $Cu_xO_y$.

* * * * *